United States Patent [19]

Honda et al.

[11] Patent Number: 5,759,973

[45] Date of Patent: Jun. 2, 1998

[54] PHOTORESIST STRIPPING AND CLEANING COMPOSITIONS

[75] Inventors: Kenji Honda, Barrington, R.I.; Taishih Maw, Fremont, Calif.; Donald F. Perry, North Providence, R.I.

[73] Assignee: Olin Microelectronic Chemicals, Inc., Norwalk, Conn.

[21] Appl. No.: 709,052

[22] Filed: Sep. 6, 1996

[51] Int. Cl.⁶ .............. C11D 7/12; C11D 7/26; C11D 7/50

[52] U.S. Cl. .............. 510/176; 510/175; 134/2; 134/38; 134/42

[58] Field of Search ............. 510/175, 176; 134/2, 38, 41, 42

[56] References Cited

U.S. PATENT DOCUMENTS

| | | | |
|---|---|---|---|
| 3,582,401 | 6/1971 | Berilla et al. | 134/3 |
| 3,961,992 | 6/1976 | Jahnke et al. | 148/6.15 R |
| 3,962,108 | 6/1976 | Perruccio | 252/142 |
| 4,015,986 | 4/1977 | Paal et al. | 96/36 |
| 4,020,040 | 4/1977 | Kattoh et al. | 260/42.56 |
| 4,051,047 | 9/1977 | Liston | 252/33 |
| 4,169,068 | 9/1979 | Harita et al. | 252/143 |
| 4,239,661 | 12/1980 | Muraoka et al. | 252/541 |
| 4,304,681 | 12/1981 | Martin et al. | 252/143 |
| 4,395,348 | 7/1983 | Lee | 252/143 |
| 4,395,479 | 7/1983 | Ward et al. | 430/258 |
| 4,401,747 | 8/1983 | Ward, Jr. et al. | 430/258 |
| 4,401,748 | 8/1983 | Ward, Jr. et al. | 430/258 |
| 4,403,029 | 9/1983 | Ward, Jr. et al. | 430/258 |
| 4,423,159 | 12/1983 | Ebra et al. | 521/35 |
| 4,428,871 | 1/1984 | Ward et al. | 252/542 |
| 4,617,251 | 10/1986 | Sizensky | 430/256 |
| 4,680,133 | 7/1987 | Ward | 252/153 |
| 4,770,713 | 9/1988 | Ward | 134/38 |
| 4,786,578 | 11/1988 | Neisius et al. | 430/256 |
| 4,791,043 | 12/1988 | Thomas et al. | 430/256 |
| 4,824,762 | 4/1989 | Kobayashi et al. | 430/258 |
| 4,824,763 | 4/1989 | Lee | 430/258 |
| 4,830,772 | 5/1989 | Van De Mark | 252/170 |
| 4,844,832 | 7/1989 | Kobayashi et al. | 252/143 |
| 4,904,571 | 2/1990 | Miyashita et al. | 430/331 |
| 4,940,759 | 7/1990 | Yang | 526/62 |
| 4,944,893 | 7/1990 | Tanaka et al. | 252/171 |
| 4,971,715 | 11/1990 | Armant et al. | 252/143 |
| 4,992,108 | 2/1991 | Ward et al. | 134/38 |
| 4,994,153 | 2/1991 | Piano et al. | 204/15 |
| 5,091,103 | 2/1992 | Dean et al. | 252/162 |
| 5,102,777 | 4/1992 | Lin et al. | 430/331 |
| 5,114,834 | 5/1992 | Nachshon | 430/329 |
| 5,128,230 | 7/1992 | Templeton et al. | 430/191 |
| 5,139,607 | 8/1992 | Ward et al. | 156/655 |
| 5,145,717 | 9/1992 | Drury | 427/96 |
| 5,174,816 | 12/1992 | Aoyama et al. | 106/203 |
| 5,185,235 | 2/1993 | Sato et al. | 430/331 |
| 5,219,700 | 6/1993 | Nakai et al. | 430/191 |
| 5,234,795 | 8/1993 | Jeffries, III et al. | 430/326 |
| 5,266,440 | 11/1993 | Zampini | 430/192 |
| 5,279,771 | 1/1994 | Lee | 252/548 |
| 5,308,745 | 5/1994 | Schwartzkopf | 430/329 |
| 5,334,332 | 8/1994 | Lee | 252/548 |
| 5,381,807 | 1/1995 | Lee . | |
| 5,409,800 | 4/1995 | Sato et al. | 430/263 |
| 5,417,802 | 5/1995 | Obeng | 216/13 |
| 5,419,779 | 5/1995 | Ward | 134/38 |
| 5,419,995 | 5/1995 | Zampini | 430/192 |
| 5,446,126 | 8/1995 | Honda | 528/482 |
| 5,472,830 | 12/1995 | Honda | 430/331 |
| 5,480,585 | 1/1996 | Shiotsu et al. | 252/544 |

(List continued on next page.)

FOREIGN PATENT DOCUMENTS

| | | |
|---|---|---|
| 0 647 884 A1 | 4/1995 | European Pat. Off. . |
| 143920 | 9/1980 | German Dem. Rep. . |
| 143921 | 9/1980 | German Dem. Rep. . |
| 3821231 | 1/1989 | Germany . |
| 3828513 | 3/1990 | Germany . |
| 56-115368 | 2/1980 | Japan . |
| 63-050838 | 3/1988 | Japan . |
| 63-208043 | 8/1988 | Japan . |
| 1-042653 | 2/1989 | Japan . |
| 1-013217 | 3/1989 | Japan . |
| 1-081949 | 3/1989 | Japan . |
| 1-081950 | 3/1989 | Japan . |
| 1-088548 | 4/1989 | Japan . |
| 1-114846 | 5/1989 | Japan . |
| 1-133049 | 5/1989 | Japan . |
| 2-048668 | 2/1990 | Japan . |
| 2-131239 | 5/1990 | Japan . |
| 2-253265 | 10/1990 | Japan . |
| 4-124668 | 4/1992 | Japan . |
| 5-045894 | 2/1993 | Japan . |
| 5-024498 | 4/1993 | Japan . |
| 4-350660 | 11/1993 | Japan . |
| 7-028254 | 1/1995 | Japan . |
| 7-244386 | 9/1995 | Japan . |
| 7-271056 | 10/1995 | Japan . |
| WO 8805813 | 8/1988 | WIPO . |

OTHER PUBLICATIONS

"Development Of Advanced Corrosion Free Organic Strippers For ULSI Processing" by A.L.P. Rotondaro, K. Honda, T. Maw, D. Perry, M. Lux, M.M. Heyns, C. Claeys and I. Daraktchiev, appearing at Fourth International Symposium On Cleaning Technology In Semiconductor Device Manufacturing, Oct. 1995, Chicago, Illinois.

"Investigation Of Advanced Organic Strippers For ULSI Processing" by A.L.P. Rotondaro, R.M. Gluck, M. Meuris, M.M. Heyns C. Claeys, K. Honda and I. Daraktchiev for presentation at INTERFFACE 94, Nov. 1994, San Diego, CA.

"Thin Film Pitting: Is NMP the Culprit?", by Dr. Franco T. Lee, Dr. David R. Wanlass and B. Walsh, appearing in Semiconductor International, Jun. 1994.

Primary Examiner—Douglas J. McGinty
Attorney, Agent, or Firm—Ohlandt, Greeley, Ruggiero & Perle

[57] ABSTRACT

A stripping and cleaning composition comprising water, at least one amine compound, and at least one corrosion inhibitor selected from (a) quaternary ammonium silicate and (b) a catechol nucleus-containing oligomer having a molecular weight of about 220 to about 5,000, and optionally a polar organic solvent.

15 Claims, No Drawings

U.S. PATENT DOCUMENTS

| | | | |
|---|---|---|---|
| 5,482,566 | 1/1996 | Lee | 134/42 |
| 5,496,491 | 3/1996 | Ward et al. | 252/153 |
| 5,507,978 | 4/1996 | Honda | 252/544 |
| 5,561,105 | 10/1996 | Honda | 510/178 |
| 5,571,642 | 11/1996 | Wakata et al. | 430/7 |
| 5,571,886 | 11/1996 | Zampini | 528/143 |
| 5,612,304 | 3/1997 | Honda et al. | 510/176 |
| 5,648,324 | 7/1997 | Honda et al. | 510/176 |
| 5,672,577 | 9/1997 | Lee | 510/175 |

PHOTORESIST STRIPPING AND CLEANING COMPOSITIONS

BACKGROUND OF THE INVENTION

1. Field of the Invention

This invention relates to stripping and cleaning compositions that remove photoresist films and plasma etching residues simultaneously from a semiconductor substrate.

2. Brief Description of Art

In the manufacture of microcircuits, positive resists are used as masking materials to form patterns onto the substrate during etching. One of the final steps in microcircuit manufacturing is removal of this photoresist from the substrate. In general, this step is affected by two methods. One method involves chemically removing the photoresist from the imaged substrate in a process known as "wet stripping". The wet process entails exposing the wafer to a photoresist stripper that consists primarily of an organic solvent and an organic amine. However, irradiation of photoresists by UV or plasma energy used during microcircuit fabrication causes the photoresist to become highly crosslinked and difficult to remove with stripper solutions. In addition, the chemicals used in wet stripping methods have been generally ineffective in removing inorganic residues formed in an earlier plasma etching step. (These residues are sometimes called "sidewall polymers".)

An alternative method of removing photoresist involves exposing the photoresist-covered substrate to an oxygen plasma to burn the remaining photoresist from the substrate. This process is known as oxygen plasma ashing. Recently, the oxygen plasma ashing method has become the preferred method for removal of photoresist because oxygen plasma can easily burn highly crosslinked photoresists to $CO_2$ and, thus, remove the photoresist film from the substrate. Also, this dry process is carried out in a vacuum chamber and is less susceptible to particulate or metallic contamination. However, sidewall polymers and other inorganic substances may still be present after the ashing process is complete. Hence, additional steps after oxygen plasma ashing are necessary to remove these residues completely.

Although oxygen plasma ashing is effective in removing photoresist films as well as highly crosslinked photoresist materials, over-exposure of the oxygen plasma to wafer substrates could damage some device structures image-patternized onto the substrates. In addition, the over-exposure of the oxygen plasma ashing could make the plasma etching residues more difficult to remove from the substrates. Therefore, one preferred treatment today is to carefully apply the oxygen plasma ashing to partially remove the photoresist film and follow with a wet stripper/ cleaner treatment to completely remove organic photoresists, as well as inorganic plasma etching residues in the final step.

In the final step, removal of the partially removed photoresists and plasma etching residues is accomplished by exposing the substrate to a stripping and cleaning composition. Several commercial products are available for this purpose. For example, EKC 265, obtained from EKC Technology, Inc., is a solution composed of water, alkanolamine, catechol, and hydroxylamine having a pH of about 12. Such a composition is disclosed in U.S. Pat. Nos. 5,279,771 and 5,334,332 to Lee. However, hydroxylamine is not stable upon heating especially in alkaline pH region. ACT 930 is a cleaning solution available from Ashland Chemical consisting of water, alkanolamine and catechol. R-10 (Mitsubishi Gas Chemical) is a cleaning solution composed of water, an alkanolamine, and sugar alcohol.

These products are effective in removing most of the plasma etching residues, but are also known to cause some metal corrosion. The aqueous environment of these cleaners is thought to produce hydroxide ions which are effective at removing sidewall polymers, but cause undesirable corrosion of the metal substrate as a side effect.

Several references exist in this application area. Japanese Patent Application No. 7-028254 assigned to Kanto Kagaku discloses a non-corrosive resist removal liquid comprising a sugar alcohol, an alcohol amine, water, and a quaternary ammonium hydroxide.

U.S. Pat. No. 4,239,661 to Muraoka et al. disclose a surface treating agent comprising an aqueous solution of 0.01 to 20% trialkyl(hydroxyalkyl) ammonium hydroxide. This treating agent is useful for removal of organic and inorganic contaminates deposited on the surface of intermediate semiconductor products.

U.S. Pat. No. 4,992,108 to Ward et al. discloses a non-aqueous biodegradable negative photoresist stripping composition containing a selected aromatic hydrocarbon solvent (e.g., diisopropylbenzene, dipropyl benzene, diethylbenzene, and the like), and selected aromatic sulfonic acids (e.g., benzene sulfonic acid; tolylsulfonic acid; naphthalene sulfonic acid; and dodecylbenzene sulfonic acid). Other solvents, such as pentanol, heptanol, octanol, dipentyl ether, etc., may be added in minor amounts.

U.S. Pat. No. 5,472,830 to Honda discloses a non-corrosive photoresist stripping composition containing an organic polar solvent having a dipole moment of no more than 3.5, an amine compound, an amino acid having a hydroxyl group, and optionally water.

BRIEF SUMMARY OF THE INVENTION

The present invention is directed to a stripping and cleaning composition comprising: (1) water; (2) at least one amine compound; (3) at least one corrosion inhibitor selected from the group consisting of (a) quaternary ammonium silicate and (b) a catechol nucleus-containing oligomer having a molecular weight of about 220 to about 5,000; and (4) optionally a polar organic solvent.

DETAILED DESCRIPTION OF THE PREFERRED EMBODIMENTS OF THE INVENTION

The stripping and cleaning composition of the present invention is useful in removing remaining photoresist films and plasma etching residues formed on a photoresist-coated silicon wafer following photoresist ashing. The components of the present composition include water, at least one amine compound, and at least one selected corrosion inhibitor. Optionally, an organic solvent and a chelating compound may be added.

Amine compounds useful in the composition of the invention include primary amines, secondary amines, tertiary amines, and the like. Alkanolamines are particularly useful in the composition of the invention, e.g., amines having a hydroxy group, such as monoethanolamine, 2-(2-aminoethoxy)ethanol, 2-(2-aminoethylamino)ethanol), and the like. It is also possible to use a combination of amines and alkanolamines. Preferably, a blend ratio of water to amine in the composition of the invention is in the range of about 10:90 to about 90:10, more preferably 20:80 to 60:40.

As stated above, the corrosion inhibitors used in the stripper and cleaner compositions of the present invention are either at least one quaternary ammonium silicate or at least one catechol nucleus-containing oligomer or mixtures thereof. Of course, these corrosion inhibitors may be used in combination with other conventional corrosion inhibitors used in the photoresist stripper and cleaner art.

Suitable quaternary ammonium silicates include tetramethylammonium silicate.

Some of catechol nucleus-containing oligomers useful in the composition of the invention are commercially available; for example, the following compounds are available from Honshu Chemical: 4,4'-[(3,4-dihydroxyphenyl)methylene]bis[2-methylphenol], trade name of Tris P-234, 4-(1',3',4',9'a-tetrahydro-5',6'-dihydroxyspiro[cyclohexane-1,9'-[9H]xanthen]-4'a(2'H)-yl)-1,2,3-benzenetriol, trade name of Pyrogallol Flavan Z, and 4,4'-[1,4-phenylenebis(1-methylethylidene)bis[1,2,3-benzenetriol, trade name of Bis PG-P.

In addition, more catechol nucleus-containing oligomers useful in the composition of the invention can be synthesized by addition-condensation reaction of catechol with formaldehyde or related aldehydes or ketones in the presence or absence of other phenolic compounds. The phenolic compounds added to catechol should preferably have hydrophilic groups to increase their solubility in the stripping and cleaning compositions of the invention of the resulting oligomers that have a molecular weight in the range of about 220 to about 5,000.

Preferably, the corrosion inhibitor is present in the composition of the invention in the range of about 0.01% to about 10% by weight to a total weight of the composition.

Optional solvents useful in the composition of the invention include solvents comprising cyclic amides. Exemplary cyclic amides include N-alkyl-2-pyrrolidones (e.g., N-methylpyrrolidone, N-ethylpyrrolidone, N-propylpyrrolidone, N-isopropylpyrrolidone, N-hydroxyethyl-2pyrrolidone), and 1,3-dialkyl-2-imidazolidinones. A suitable solvent mixture may be an admixture of N-hydroxyethylpyrrolidone (HEP) and 1,3-dimethyl-2imidizolidinone (DMI) wherein the mixing ratio of HEP to DMI is from about 95%:5% to about 5%:95% by weight. Preferably, the solvent component of the composition comprises about 10 to about 70 percent by weight of the total composition.

According to another preferred embodiment of the present invention, any optional chelating agent that may be solubilized in the polar solvent may be used. Preferred chelating agents include sugars such as glucose, fructose, and sucrose, or sugar alcohols, such as xylitol, mannitol, and sorbitol.

Various other ingredients known to those skilled in the art may optionally be included in the composition, e.g., dyes or colorants, wetting agents, surfactants, antifoamers and so forth. Generally the amount of each of these optional ingredients would be about 0.5% by weight, based on the total composition.

The described stripping and cleaning composition is used in removing an organic polymeric material from a substrate. The method of the invention is carried out by contacting an organic polymeric material with the described stripping and cleaning composition. The actual conditions, i.e., temperature, time, and the like, may vary over wide ranges and are generally dependent on the nature and thickness of the organic polymeric material to be removed, as well as other factors familiar to those skilled in the art. In general, however, temperatures ranging from about 15° C. to about 100° C. for a period of about 10 seconds to about 30 minutes are typical.

A variety of means can be employed in contacting the organic polymeric material with the stripping and cleaning composition in the practice of the invention. For example, the substrate containing polymeric material can be immersed in a stripping and cleaning bath or the stripping and cleaning composition can be sprayed over the surface of the organic polymeric material, as will be apparent to those skilled in the art.

The stripping and cleaning composition of the invention is effective in removing a wide variety of organic polymeric materials from substrates. Exemplary organic materials include positive and negative resists, electron beam resists, x-ray resists, ion beam resists, as well as organic dielectric materials such as polyamide resins, and so forth. Specific examples of organic polymeric materials which can be removed in the practice of the invention include positive resists containing phenol formaldehyde resins or poly(p-vinylphenol); negative resists containing cyclized polyisoprene or poly(p-vinylphenol); and polymethylmethacrylate-containing resists. In particularly preferred embodiments of the invention, the stripping composition has been found to be highly effective in removing positive resists containing phenol formaldehyde resins. The organic polymeric material can be removed from any of the conventional substrates known to those skilled in the art, such as silicon, silicon dioxide, silicon nitride, polysilicon, aluminum, aluminum alloys, copper, copper alloys, polyamides, and so forth.

The following synthesis and examples are intended to illustrate the various aspects of the invention, but are not intended to limit the scope of the invention. All percentages and parts are by weight and all temperatures are degrees Celsius unless explicitly stated otherwise.

SYNTHESIS 1

N-methyl-2-pyrrolidone (NMP), 110 grams, was placed in a 500 ml flask equipped with a mechanical stirrer, a condenser, and a dropping funnel, and the flask was heated to 70°–75° C. with stirring. Catechol, 110 grams, was gradually added to NMP with stirring, followed by 65.5 grams of 36.7% aqueous formalin, added dropwise to the reaction solution over an hour. An aqueous solution of 7.0 wt % oxalic acid (18.08 grams) was slowly added to the above solution for 30 minutes. The reaction mixture was heated at a refluxing temperature of water with stirring for an additional 8 hours, and then heated at about 110° C. to remove water from the reaction solution by distillation.

The resulting viscous solution was characterized by GPC (Gel Permeation Chromatography) to measure the molecular weight using a polystyrene standard reference. A weight-average molecular weight of the reaction product was 1,758 with a polydispersity of 1.71. A solid content of the solution was 42 wt %.

EXAMPLE 1

A stripping and cleaning solution was prepared by mixing DEGA and $H_2O$ at 60:40 by weight ratio and adding the product obtained in Synthesis 1 as a solution to the DEGA/$H_2O$ mixture at 10 wt %.

Al—Si—Cu deposited wafers were immersed in the above solution for 60 minutes at room temperature, and followed by deionized water rinse for 1 minute. The surface resistance of the wafer was measured with Prometrix VP 10 before and after the stripping test so that a film loss of Al—Si—Cu layer deposited on wafers was determined.

The resistance test result showed that no film loss of Al—Si—Cu was observed with the above-described stripping and cleaning composition.

The stripping and cleaning test of photoresists and plasma etching residues was carried out with a wafer having a multilayer of a positive photoresist/$SiO_2$/TiN/Al—Si—Cu patternwise deposited onto a silicon substrate. The top layer of photoresist was partially removed by oxygen plasma ashing. The thus prepared wafer was immersed in the above-mentioned solution at 80° C. for 30 minutes with no agitation, followed by IPA (isopropyl alcohol) rinse for 60 seconds and further $H_2O$ rinse for 5 minutes at room temperature.

The wafer was analyzed by a field emission type scanning electron microscope (SEM). The photoresists and plasma etching residues were completely removed and the metal layers of Al—Si—Cu and TiN were not significantly attacked under this condition.

COMPARISON 1

A reference stripping solution was prepared according to the steps outlined in Example 1 except that no corrosion inhibitor was added. The stripping test was conducted according to the same method as described in Example 1. SEM analysis showed severe metal corrosion and complete removal of the plasma etching residues and photoresists.

While the invention has been described above with reference to specific embodiments thereof, it is apparent that many changes, modifications and variations can be made without departing from the inventive concept disclosed herein. Accordingly, it is intended to embrace all such changes, modifications and variations that fall within the spirit and broad scope of the appended claims. All patent applications, patents and other publications cited herein are incorporated by reference in their entirety.

What is claimed is:

1. A stripping and cleaning composition, comprising;
   (A) water;
   (B) at least one alkanolamine compound; and
   (C) at least one corrosion inhibitor selected from the group consisting of at least one quaternary ammonium silicate; 4,4'-[(3,4-dihydrophenyl)methylene]bis[2-methylphenol]; 4-(1',3',4',9'a-tetrahydro-5',6'-dihydroxyspiro[cyclohexane1,9'-[9H]xanthen]-4'a (2'H)-yl)-1,2,3-benzenetriol; and 4,4'-[1,4-phenylenebis(1-methylethylidene]bis[1,2,3benzenetriol].

2. The stripping and cleaning composition of claim 1 wherein said composition additionally comprises (D) a polar organic solvent.

3. The stripping and cleaning composition of claim 1 wherein the weight ratio of water to alkanolamine is about 10:90 to about 90:10.

4. The stripping and cleaning composition of claim 1, wherein said alkanolamine is selected from the group of monoethanolamine, 2-(2-aminoethoxy)ethanol and 2-(2aminoethylamino)ethanol.

5. The stripping and cleaning composition of claim 2 wherein said polar organic solvent is at least one cyclic amide.

6. The stripping and cleaning composition of claim 1 wherein said quaternary ammonium silicate is tetramethylammonium silicate.

7. The stripping and cleaning composition of claim 5 wherein the quaternary ammonium silicate is present in said composition in the range of about 0.01% to about 10% by weight, based on the total weight of the composition.

8. The stripping and cleaning composition of claim 5 wherein said cyclic amide is selected from the group consisting of N-alkyl-2-pyrrolidone and 1,3-dialkyl-2imidazolidinone.

9. The stripping and cleaning composition of claim 5 wherein said cyclic amide is an admixture of N-hydroxyethylpyrrolidone (HEP) and 1,3-dimethyl-2-imidazolidinone (DMI), wherein the weight ratio of HEP to DMI is from about 95:5 to about 5:95 by weight.

10. The stripping and cleaning of claim 2 wherein said organic solvent is present in an amount of from 10% to about 70% by weight of the total composition.

11. The stripping and cleaning composition of claim 1 wherein said composition additionally comprises a chelating agent.

12. The stripping and cleaning composition of claim 11 wherein said chelating agent is selected from the group consisting of glucose, fructose, sucrose and sugar alcohols.

13. The stripping and cleaning composition of claim 1 wherein said corrosion inhibitor is 4,4'-[(3,4-dihydrophenyl) methylene]bis[2-methylphenol].

14. The stripping and cleaning composition of claim 1 wherein said corrosion inhibitor is 4-(1',3',4',9'a-tetrahydro-5',6'-dihydroxyspiro[cyclohexane-1,9'-[9H]xanthen]4'a (2'H)-yl)-1,2,3-benzenetriol.

15. The stripping and cleaning composition of claim 1 wherein said corrosion inhibitor is 4,4'-[1,4--phenylenebis (1-methylehylidene]bis[1,2,3-benzenetriol].

* * * * *

UNITED STATES PATENT AND TRADEMARK OFFICE
CERTIFICATE OF CORRECTION

PATENT NO. : 5,759,973

DATED : June 2, 1998

INVENTOR(S) : Kenji Honda, Taishih Maw, and Donald F. Perry

It is certified that error appears in the above-identified patent and that said Letters Patent is hereby corrected as shown below:

Column 5, line 42, cancel "dihydroxyspiro[cyclohexane1,9'-[9H]xanthen]-4'a" and insert --dihydroxyspiro[cyclohexane-1,9'-[9H]xanthen]-4'a--.

Column 5, line 45, cancel "3benzenetriol]." and insert --3-benzenetriol].--.

Column 6, line 7, cancel "2-(2aminoethylamino)ethanol." and insert --2-(2-aminoethylamino)ethanol.--.

Column 6, line 14, cancel "5" and insert --1--.

Column 6, line 22, cancel "2imidazolidinone." and insert --2-imidazolidinone.--.

Signed and Sealed this

Thirteenth Day of October 1998

Attest:

Attesting Officer

BRUCE LEHMAN

Commissioner of Patents and Trademarks